US009865625B2

(12) United States Patent
Chen et al.

(10) Patent No.: US 9,865,625 B2
(45) Date of Patent: Jan. 9, 2018

(54) ARRAY SUBSTRATE AND METHOD OF MANUFACTURING THE SAME, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Lei Chen, Beijing (CN); Zhilong Peng, Beijing (CN); Wukun Dai, Beijing (CN); Huanping Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/801,531

(22) Filed: Jul. 16, 2015

(65) Prior Publication Data

US 2016/0190162 A1    Jun. 30, 2016

(30) Foreign Application Priority Data

Dec. 31, 2014    (CN) .......................... 2014 1 0857208

(51) Int. Cl.
*H01L 27/12*    (2006.01)
(52) U.S. Cl.
CPC ............................... *H01L 27/1244* (2013.01)
(58) Field of Classification Search
CPC ........... H01L 27/1248; G02F 1/133345; G02F 2001/13629
See application file for complete search history.

(56) References Cited

U.S. PATENT DOCUMENTS 5,287,206 A    2/1994 Kanemori et al.
2003/0151711 A1*    8/2003 Yuh ................... G02F 1/134363
349/129
(Continued)

FOREIGN PATENT DOCUMENTS

CN    101097320 A    1/2008
CN    102629573    8/2012
(Continued)

OTHER PUBLICATIONS

First Chinese Office Action (including English translation) dated Nov. 1, 2016, for corresponding Chinese Application No. 201410857208.5.
(Continued)

*Primary Examiner* — Thomas L Dickey
(74) *Attorney, Agent, or Firm* — Kinney & Lange, P.A.

(57) ABSTRACT

The present disclosure provides an array substrate and a method of manufacturing the same, and a display device. TA connecting portion is provided within the overlapping region between the first signal line and the second signal line, is electrically conductive and directly contacts the second signal line. Thus, even when the upper second signal line is broken due to the large step difference within the overlapping region between the first signal line and the second signal line, the connecting portion electrically connected with the broken second signal line can still electrically connect and conduct the broken second signal line, thereby avoiding transmission of signal from being adversely affected by the broken signal line within the overlapping region.

12 Claims, 6 Drawing Sheets

(56) References Cited

U.S. PATENT DOCUMENTS

| | | | | |
|---|---|---|---|---|
| 2008/0002125 A1* | 1/2008 | Kim | ............... | G02F 1/136209 |
| | | | | 349/140 |
| 2014/0049455 A1* | 2/2014 | Kim | ............... | G09G 3/3233 |
| | | | | 345/76 |

FOREIGN PATENT DOCUMENTS

| | | |
|---|---|---|
| CN | 103513482 A | 1/2014 |
| CN | 103605242 | 2/2014 |
| JP | H05119345 A | 5/1993 |
| JP | H0829805 A | 2/1996 |
| WO | 2012133158 A1 | 10/2012 |

OTHER PUBLICATIONS

Third Chinese Office Action, for Chinese Patent Application No. 201410857208.5, dated May 22, 2017, 11 pages.
Fourth Chinese Office Action, for Chinese Patent Application No. 201410857208.5, dated Jul. 13, 2017, 13 pages.
Second Chinese Office Action, for Chinese Patent Application No. 201410857208.5, dated Mar. 17, 2017, 10 pages.
Chinese Rejection Decision, for Chinese Patent Application No. 201410857208.5, dated Sep. 26, 2017, 19 pages.

* cited by examiner

ARRAY SUBSTRATE AND METHOD OF MANUFACTURING THE SAME, AND DISPLAY DEVICE

CROSS-REFERENCE TO RELATED APPLICATION

This application claims the benefit of Chinese Patent Application No. 201410857208.5 filed on Dec. 31, 2014 in the State Intellectual Property Office of China, the whole disclosure of which is incorporated herein by reference.

BACKGROUND OF THE INVENTION

Field of the Invention

Embodiments of the present disclosure generally relate to the technical field of semiconductor technologies, and particularly, to an array substrate and a method of manufacturing the same, and a display device comprising the array substrate.

Description of the Related Art

With the continuous development of display technologies, requirements to resolution (Pixel per inch, PPI) and pixel aperture ratio of display products become ever higher. Thus, pixel sizes and pixel pitches on the array substrate in a display panel become smaller, and thereupon, signal lines become thinner.

For example, in a crystal display panel where source signal lines and gate signal lines on the array substrate are thinner, as shown in FIG. 1a and FIG. 1b, where FIG. 1b is a cross sectional view taken along an A-A' direction in FIG. 1a, the source signal lines 2 and the gate signal lines 1 cross and overlap with each other. Since the underlying gate signal line 1 has a thickness, the upper source signal line 2 span over the gate signal line 1 like a bridge at the overlapping region, thereby a step difference is present on the source signal line 2 within the overlapping region, that is, there is a distance difference h between the highest portion and the lowest portion of the source signal line 2. Generally, the larger the thickness of the gate signal line 1 below the source signal line 2 is, the larger the step difference present on source signal line 2 within the overlapping region is. Due to the presence of the step difference, the source signal line 2 will be easily broken within a region where the step difference is larger, adversely affecting signal transmission.

SUMMARY OF THE INVENTION

In view of the above, embodiments of the present disclosure provide an array substrate and a method of manufacturing the same, and a display device comprising the array substrate, which are intended to solve the problem in prior arts that the signal lines will be easily broken within the overlapping region and thus transmission of signal is adversely affected.

Thus, an embodiment of the present disclosure provides an array substrate, comprising a base substrate, first signal lines and second signal lines arranged in different layers on the base substrate, and an insulating layer between the first signal lines and the second signal lines;

the second signal lines are located above the first signal lines, and the first signal lines and the second signal lines extend in different directions so as to form overlapping regions therebetween;

connecting portions are further provided between the insulating layer and a layer where the second signal lines are located, and at least cover one of the overlapping regions; and the connecting portions are electrically conductive, and the connecting portions directly contact the second signal lines.

In one example, the above array substrate provided according to embodiments of the present disclosure may further comprise pixel electrodes between the insulating layer and the layer where the second signal lines are located, the connecting portions are made of the same material and provided in the same layer as the pixel electrodes.

In one example, in the above array substrate provided according to embodiments of the present disclosure, the thickness of the connecting portions is the same as that of the pixel electrodes.

In one example, in the above array substrate provided according to embodiments of the present disclosure, the material of the pixel electrodes is indium tin oxide.

In one example, in the above array substrate provided according to embodiments of the present disclosure, the first signal lines may include source signal lines, and the second signal lines may include gate signal lines; or, the first signal lines may include gate signal lines, and the second signal lines may include source signal lines.

In one example, in the above array substrate provided according to embodiments of the present disclosure, the first signal lines further comprise a common electrode line, or the second signal lines further comprise the common electrode line.

In one example, in the above array substrate provided according to embodiments of the present disclosure, one of the connecting portions is provided to correspond to one of the overlapping regions, and the connecting portions are electrically insulated from each other.

Correspondingly, an embodiment of the present disclosure further provides a method of manufacturing an array substrate, comprising steps of: forming a pattern of first signal lines on a base substrate; forming an insulating layer on the first signal lines; and forming a pattern of second signal lines on the insulating layer, the first signal lines and the second signal lines extending in different directions so as to form overlapping regions therebetween; wherein after forming the insulating layer and before forming the pattern of the second signal lines, the method further comprises a step of: forming a pattern of connecting portions on the insulating layer to at least cover one of the overlapping regions, the connecting portions being electrically conductive and directly contacting the second signal lines.

In one example, in the method provided according to the embodiment of the present disclosure, in order to simplify manufacturing process and reduce production cost, the step of forming the pattern of the connecting portions may include:

forming a conductive layer on the insulating layer; and forming a pattern including pixel electrodes and the connecting portions in the conductive layer by performing a patterning process one time.

Correspondingly, an embodiment of the present disclosure further provides a display device, comprising the array substrate provide according to any one of the embodiments of the present disclosure.

With the above array substrate and method of manufacturing the same, and the display device provided according to embodiments of the present disclosure, the connecting portion is provided within the overlapping region between the first signal line and the second signal line, is electrically conductive and directly contacts the second signal line, thus even when the upper second signal line is broken due to the large step difference within the overlapping region between the first signal line and the second signal line, the connecting portion electrically connected with the broken second signal line can still electrically connect and conduct the broken second signal line, thereby avoiding transmission of signal from being adversely affected by the broken signal line within the overlapping region.

BRIEF DESCRIPTION OF THE DRAWINGS

FIG. 1b is a schematic structural cross-sectional view of the array substrate taken along an A-A' direction shown in FIG. 1a;

FIG. 2b is a schematic structural cross-sectional view of the array substrate taken along a B-B' direction shown in FIG. 2a;

FIG. 3b is a schematic structural cross-sectional view of the array substrate taken along a C-C' direction shown in FIG. 3a.

DETAILED DESCRIPTION OF PREFERRED EMBODIMENTS OF THE INVENTION

Figure 1A:
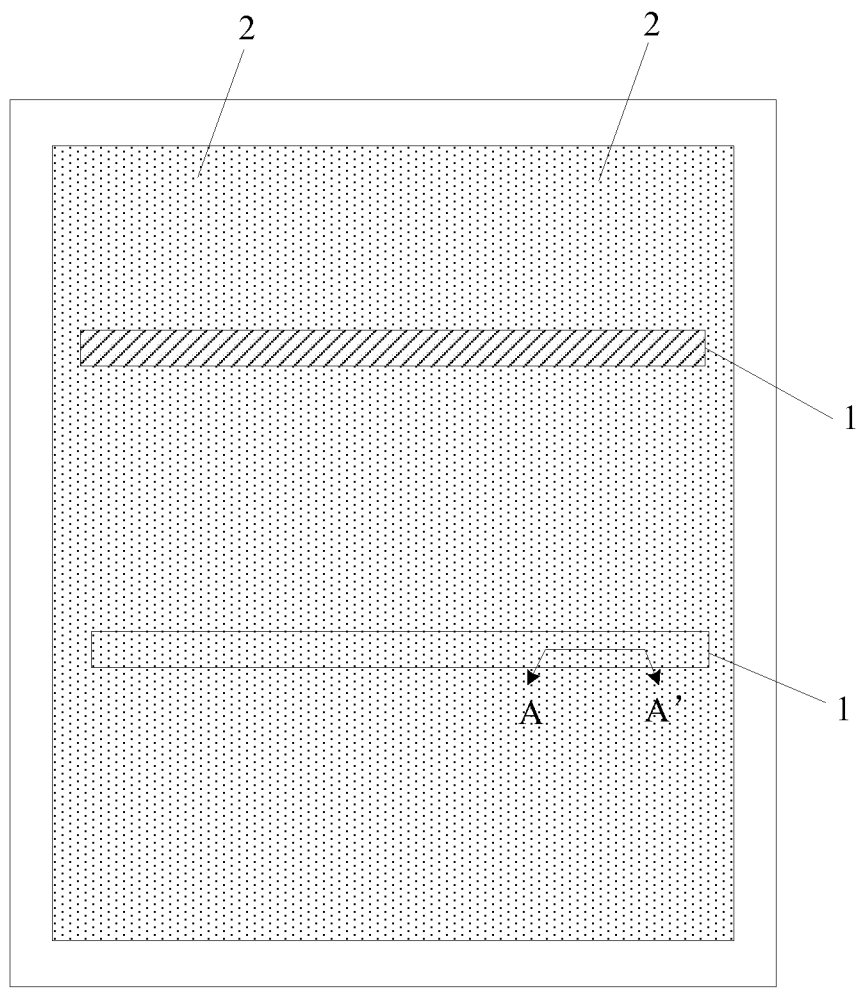
FIG. 1a is a schematic structural top view of an existing array substrate.
Figure 1B:
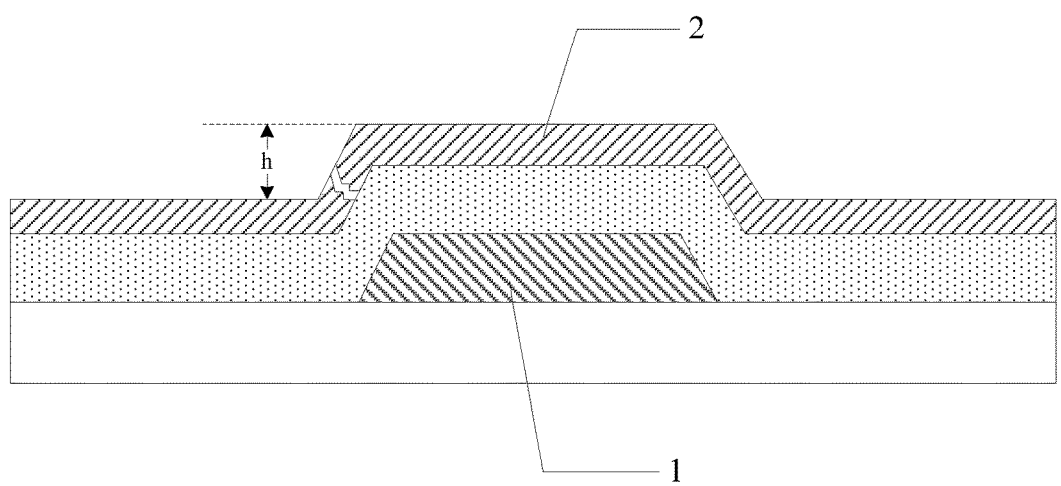

Exemplary embodiments of the present invention will be described hereinafter in detail with reference to the attached drawings, wherein the like reference numbers refer to the like elements. In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Sizes and shapes of parts shown in the drawings do not indicate real proportion of the array substrate, but are only intended to schematically illustrate the present disclosure.

Figure 2A:
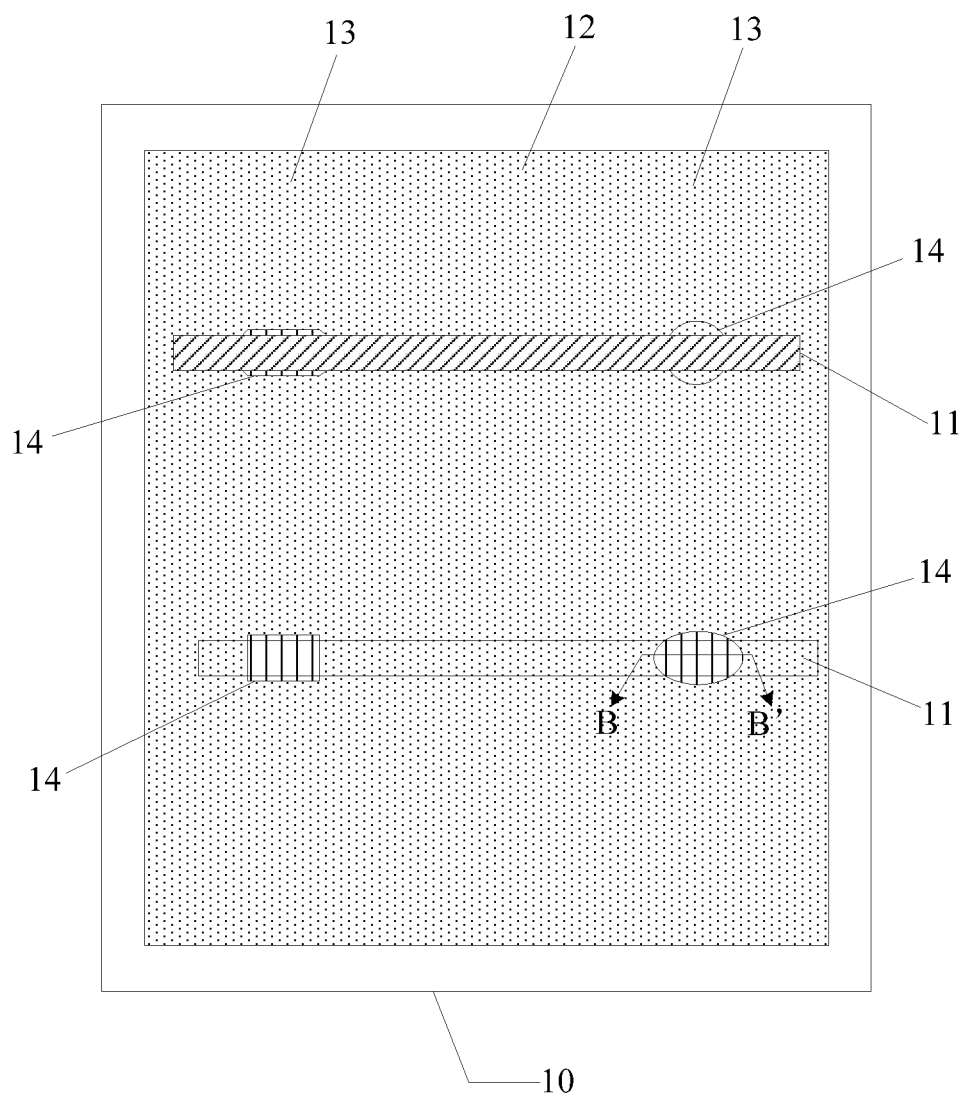
FIG. 2a is a schematic structural top view of an array substrate provided according to one exemplary embodiment of the present disclosure.
Figure 2B:
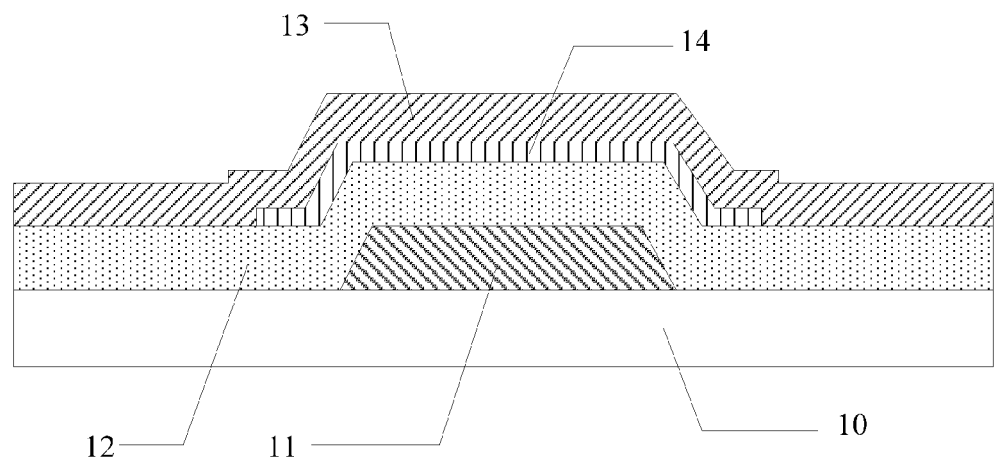

An array substrate provided according to one exemplary embodiment of the present disclosure, as shown in FIG. 2a and FIG. 2b, comprises a base substrate 10, first signal lines 11 and second signal lines 13 arranged in different layers on the base substrate 10, and an insulating layer 12 between the first signal lines 11 and the second signal lines 13; wherein the second signal lines 13 are located above the first signal lines 11, and the first signal lines 11 and the second signal lines 13 extend in different directions so as to form overlapping regions therebetween; connecting portions 14 are further provided between the insulating layer 12 and a layer where the second signal lines 13 are located, and cover at least one of the overlapping regions; and the connecting portions 14 are electrically conductive, and directly contact the second signal lines 13.

With the above array substrate provided according to embodiments of the present disclosure, the connecting portion is provided to at least cover the overlapping region between the first signal line and the second signal line, that is, the connecting portion at least overlaps with the corresponding overlapping region. This connecting portion is electrically conductive and directly contacts the second signal line, thus even when the upper second signal line is broken due to the large step difference within the overlapping region between the first signal line and the second signal line, the connecting portion electrically connected with the broken second signal line can still function to electrically connect and conduct the broken second signal line, thereby avoiding transmission of signal from being adversely affected by the broken signal line within the overlapping region. Alternatively, the connecting portion may be formed at least within a region where the signal line is easily broken due to step difference, for example, within a region corresponding to a step of the signal line, so that when the signal line is broken in the region, the connecting portion electrically connected with the signal line can still electrically connect and conduct the signal line.

Further, when patterning the second signal lines during manufacturing the above array substrate, since a distance between a surface of a photoresist layer covering over the second signal lines and the base substrate is constant, that is, the thickness of the photoresist layer is small within a region where the distance between a surface of the second signal lines and the base substrate is large, and is large within a region where the distance between the surface of the second signal lines and the base substrate is small, and since the connecting portions are arranged between the insulating layer and the second signal lines and at least cover the overlapping regions, the thickness of the photoresist layer can be reduced within a region where the step difference of second signal lines is formed, thereby reducing difficulty of peeling off the photoresist located within the region where the step difference is formed when forming the second signal lines, and thus reducing the breaking problem of the second signal lines due to large difficulty in peeling off the photoresist layer.

Specifically, in the above array substrate provided according to embodiments of the present disclosure, the connecting portion may has a circular, elliptic, rectangular or other irregular shape, which is not limited herein.

It is noted that the above array substrate provided according to embodiments of the present disclosure may be any array substrate which has first signal lines and second signal lines insulated from each other and having overlapping regions therebetween, for example, an array substrate of a liquid crystal display panel having source signal lines and gate signal lines (which are respectively the first signal lines and the second signal lines), an array substrate of a mutual capacitance touch panel having touch drive lines and drive sensing lines (which are respectively the first signal lines and the second signal lines), or the like, which is not limited herein.

Specifically, in the above array substrate provided according to embodiments of the present disclosure, the connecting portions may be made of metal material, transparent conductive oxide material or other conductive materials, which is not limited herein.

In one example, when the above array substrate provided according to embodiments of the present disclosure is applied in a crystal display panel, the above array substrate provided according to embodiments of the present disclosure may further comprises pixel electrodes between the insulating layer and the layer where the second signal lines are located, the connecting portions are made of the same material and provided in the same layer as the pixel electrodes.

As such, during manufacturing the array substrate, the connecting portions and pixel electrodes may be manufactured in the same layer, no new manufacturing process is added, and it only needs to modify patterns of corresponding film layers, thereby simplifying process steps, saving production cost, and improving production efficiency.

In one example, in the above array substrate provided according to embodiments of the present disclosure, the thickness of the connecting portions may be the same as that of the pixel electrodes.

In one example, in the above array substrate provided according to embodiments of the present disclosure, the material of the pixel electrodes may be indium tin oxide, which is not limited herein.

Further, when the above array substrate provided according to embodiments of the present disclosure is applied in the liquid crystal display panel, the first signal lines include source signal lines and the second signal lines include gate signal lines, that is, the gate signal lines are located above the source signal lines; or the first signal lines include gate signal lines, and the second signal lines include source signal lines, that is, the source signal lines are located above the gate signal lines.

Further, in the above array substrate provided according to embodiments of the present disclosure, the first signal lines may further comprise a common electrode line, that is, the common electrode line and the source signal lines are arranged in the same layer, and connecting portions are also provided within overlapping regions between the common electrode line and the gate signal lines; or the second signal lines further comprise the common electrode line, that is, the common electrode line and the gate signal lines are arranged in the same layer, and connecting portions are also provided within overlapping regions between the common electrode line and the source signal lines.

Figure 3A:
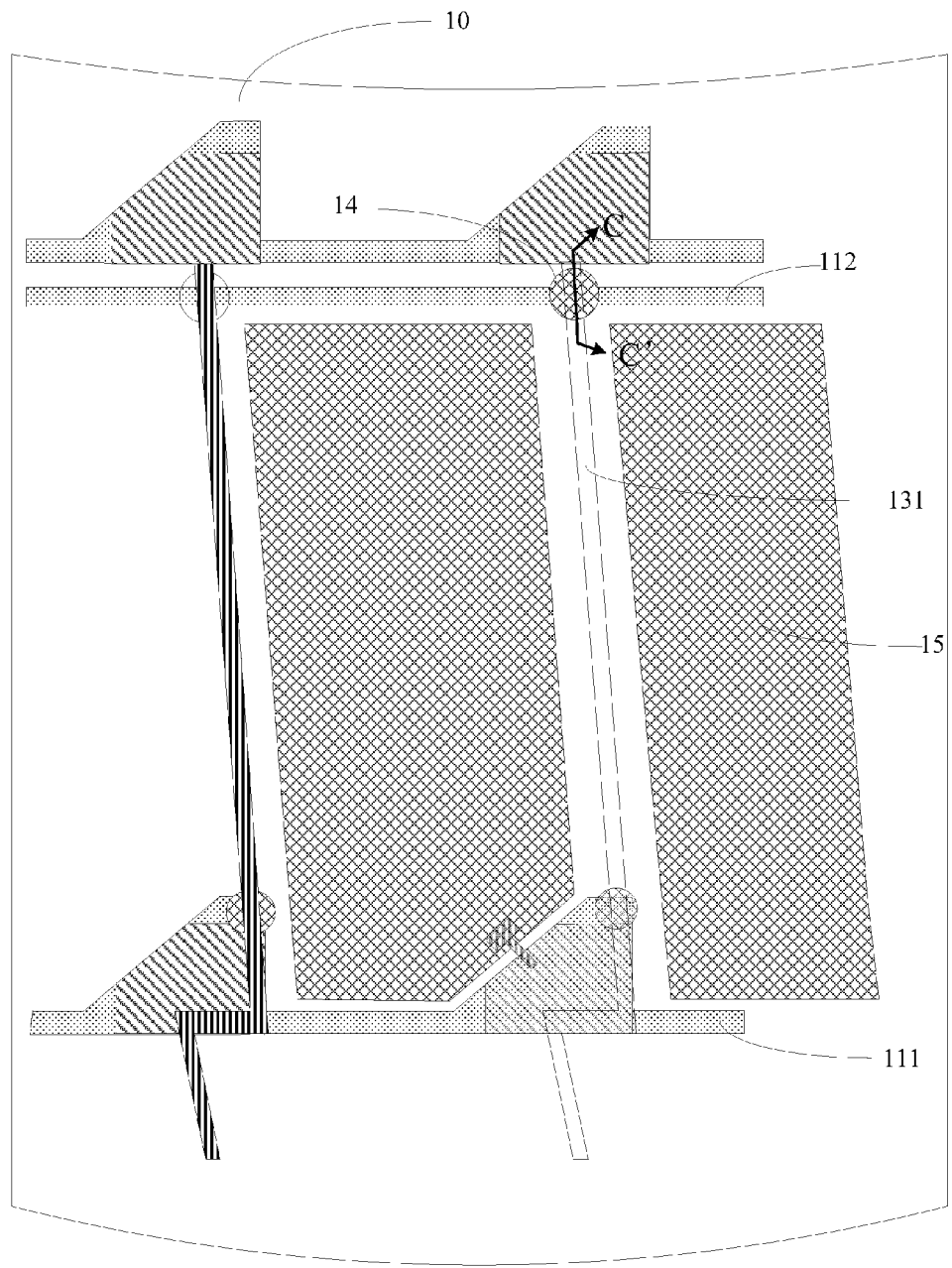
FIG. 3a is a schematic structural top view of an array substrate in a liquid crystal display provided according to another exemplary embodiment of the present disclosure.
Figure 3B:
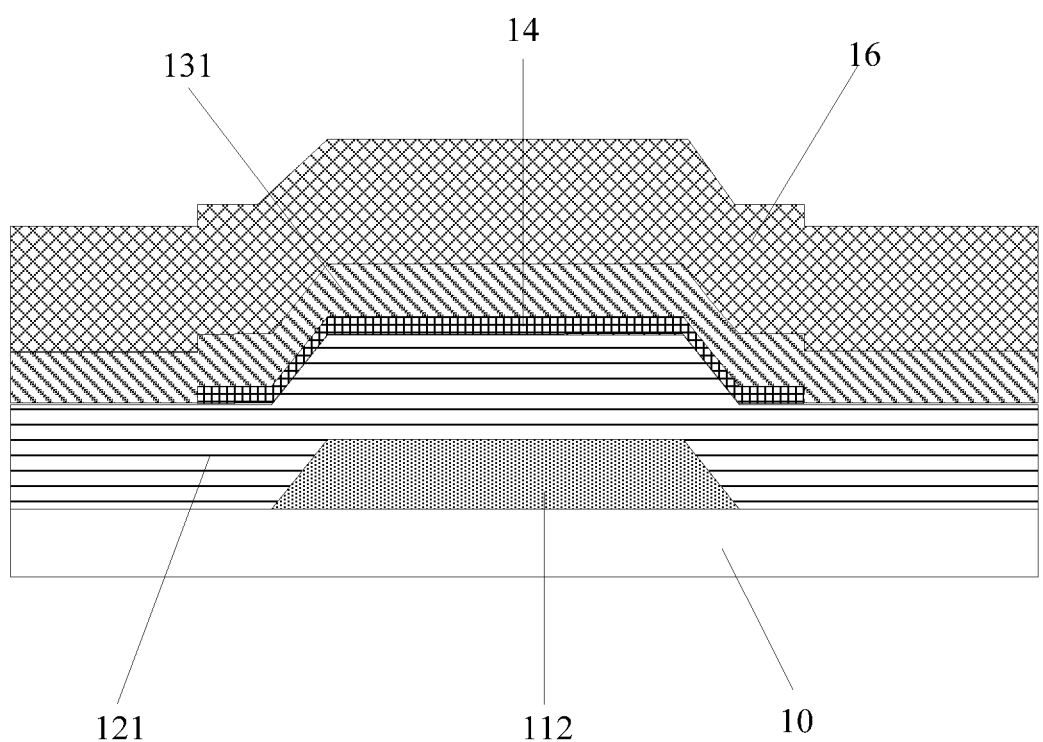

The above array substrate provided according to embodiments of the present disclosure will be illustrated with reference to a specific example. As shown in FIG. 3a and FIG. 3b, the array substrate applied in the crystal display panel comprises gate signal lines 111 and a common electrode line 112 arranged in the same layer, a gate insulating layer 121, connecting portions 14 and pixel electrodes 15 arranged in the same layer, source signal lines 131 and a source insulating layer 16, all of which are arranged on a base substrate 10 in order. Overlapping regions between the common electrode line 112 and the source signal lines 131 extending in different directions, and overlapping regions between the gate signal lines 111 and the source signal lines 131 extending in different directions are covered by the connecting portions 14 respectively. As such, with the connecting portions, not only the probability that the source signal lines are to be broken within regions where the step difference is present can be reduced, but also the connecting portions can still electrically connect and conduct the source signal lines even when the source signal lines are broken, thereby avoiding transmission of signal from being adversely affected by the broken source signal lines.

Based on the same inventive concept, an embodiment of the present disclosure further provides a method of manufacturing an array substrate, comprising steps of: forming a pattern of first signal lines on a base substrate; forming an insulating layer on the first signal lines; and forming a pattern of second signal lines on the insulating layer; the first signal lines and the second signal lines extend in different directions so as to form overlapping regions therebetween; wherein after forming the insulating layer and before forming the pattern of the second signal lines, the method further comprises forming a pattern of connecting portions on the insulating layer to at least cover one of the overlapping regions, the connecting portions being electrically conductive.

In the above method provided according to the embodiment of the present disclosure, the connecting portion is provided within the overlapping region between the first signal line and the second signal line, is electrically conductive, thus even when the upper second signal line is broken due to the large step difference within the overlapping region between the first signal line and the second signal line, the connecting portion electrically connected with the broken second signal line can still electrically connect and conduct the broken second signal line, thereby avoiding transmission of signal from being adversely affected by the broken signal line within the overlapping region. Further, when patterning the second signal lines during manufacturing the above array substrate, since a distance between a surface of a photoresist layer covering over the second signal lines and the base substrate is constant, that is, the thickness of the photoresist layer is small within a region where the distance between a surface of the second signal lines and the base substrate is large, and is large within a region where the distance between the surface of the second signal lines and the base substrate is small, and since the connecting portions are arranged between the insulating layer and the second signal lines and at least cover the overlapping regions, the thickness of the photoresist layer can be reduced within a region where the step difference of second signal lines is formed, thereby reducing difficulty of peeling off the photoresist located within the region where the step difference is formed when forming the second signal lines, and thus reducing the breaking problem of the second signal lines due to large difficulty in peeling off the photoresist layer.

In one example, in the above method provided according to the embodiment of the present disclosure, in order to simplify manufacturing process, the step of forming the pattern of the connecting portions may comprise: forming a conductive layer on the insulating layer, and forming a pattern including pixel electrodes and the connecting portions in the conductive layer by performing a patterning process one time. As such, no new manufacturing process is added, and it only needs to modify patterns of corresponding film layers, thereby simplifying process steps, saving production cost, and improving production efficiency.

Based on the same inventive concept, an embodiment of the present disclosure further provides a display device, comprising the above array substrate provided according to embodiments of the present disclosure. The display device may be display panel, a mobile phone, a tablet computer, a TV, a display, a notebook computer, a digital photo frame, a navigator, or any other products or components having a display function. Implementation of the display device may be achieved with reference to the above embodiments of the display panel, and the same parts will not be repeatedly described.

Specifically, the display panel provided according to the embodiments of present disclosure may be a Liquid Crystal Display (LCD) panel, or an Organic Light Emitting Diode (OLED) display panel, which will not be limited here. When implemented in practice, other necessary components of the display panel would be understood by those skilled in the art, and will not be repeatedly described and are not intended to limit the present disclosure.

With the above array substrate and the method of manufacturing the same, and the display device provided according to embodiments of the present disclosure, the connecting portion is provided within the overlapping region between the first signal line and the second signal line, is electrically conductive and directly contacts the second signal line, thus even when the upper second signal line is broken due to the large step difference within the overlapping region between the first signal line and the second signal line, the connecting portion electrically connected with the broken second signal line can still electrically connect and conduct the broken second signal line, thereby avoiding transmission of signal from being adversely affected by the broken signal line within the overlapping region.

Although several exemplary embodiments of the present disclosure have been shown and described, it would be appreciated by those skilled in the art that various changes or modifications may be made in these embodiments without departing from the principles and spirit of the present invention, the scope of which is defined in the claims and their equivalents.

What is claimed is:

1. An array substrate, comprising a base substrate, first signal lines and second signal lines arranged in different layers on the base substrate, and an insulating layer between the first signal lines and the second signal lines; wherein
    the second signal lines are located above the first signal lines, and the first signal lines and the second signal lines extend in different directions so as to form overlapping regions therebetween;
    electrically conductive connecting portions are further provided between the insulating layer and a layer where the second signal lines are located, and each only cover one of the overlapping regions; and
    the connecting portions electrically contact only the corresponding second signal lines only within the overlapping regions and only extend within regions corresponding to the overlapping regions, the connecting portions located within the overlapping regions formed by one of the first signal lines and all of the second signal lines are electrically insulated from each other, and the connecting portions located within the overlapping regions formed by one of the second signal lines and all of the first signal lines are electrically insulated from each other.

2. The array substrate according to claim 1, further comprising pixel electrodes between the insulating layer and the layer where the second signal lines are located; wherein the connecting portions are made of the same material and provided in the same layer as the pixel electrodes.

3. The array substrate according to claim 2, wherein a thickness of the connecting portions is the same as that of the pixel electrodes.

4. The array substrate according to claim 3, wherein
    the first signal lines include source signal lines, and the second signal lines include gate signal lines; or
    the first signal lines include gate signal lines, and the second signal lines include source signal lines.

5. The array substrate according to claim 2, wherein the material of the pixel electrodes is indium tin oxide.

6. The array substrate according to claim 5, wherein
    the first signal lines include source signal lines, and the second signal lines include gate signal lines; or
    the first signal lines include gate signal lines, and the second signal lines include source signal lines.

7. The array substrate according to claim 2, wherein
    the first signal lines include source signal lines, and the second signal lines include gate signal lines; or
    the first signal lines include gate signal lines, and the second signal lines include source signal lines.

8. The array substrate according to claim 1, wherein
    the first signal lines include source signal lines, and the second signal lines include gate signal lines; or
    the first signal lines include gate signal lines, and the second signal lines include source signal lines.

9. The array substrate according to claim 8, wherein the first signal lines further comprise a common electrode line, or the second signal lines further comprise the common electrode line.

10. A display device, comprising the array substrate according to claim 1.

11. A method of manufacturing an array substrate, comprising steps of:
    forming a pattern of first signal lines on a base substrate;
    forming an insulating layer on the first signal lines; and
    forming a pattern of second signal lines on the insulating layer, the first signal lines and the second signal lines extending in different directions so as to form overlapping regions therebetween;
    wherein after forming the insulating layer and before forming the pattern of the second signal lines, the method further comprises a step of:
        forming a pattern of electrically conductive connecting portions on the insulating layer that at least cover one of the overlapping regions, such that the connecting portions electrically contact only the corresponding second signal lines only within the overlapping regions and only extend within regions corresponding to the overlapping regions, the connecting portions located within the overlapping regions formed by one of the first signal lines and all of the second signal lines are electrically insulated from each other, and the connecting portions located within the overlapping regions formed by one of the second signal lines and all of the first signal lines are electrically insulated from each other.

12. The method according to claim 11, wherein the step of forming the pattern of the connecting portions comprises:
    forming a conductive layer on the insulating layer; and
    forming a pattern including pixel electrodes and the connecting portions in the conductive layer through one single patterning process.

* * * * *